(12) United States Patent
Kitahama et al.

(10) Patent No.: US 11,430,713 B2
(45) Date of Patent: Aug. 30, 2022

(54) FASTENING STRUCTURE AND POWER CONVERSION APPARATUS USING FASTENING STRUCTURE

(71) Applicant: Mitsubishi Electric Corporation, Tokyo (JP)

(72) Inventors: Niki Kitahama, Tokyo (JP); Ryohei Hayashi, Tokyo (JP); Hirofumi Miyoshi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 93 days.

(21) Appl. No.: 16/960,794

(22) PCT Filed: May 8, 2018

(86) PCT No.: PCT/JP2018/017729
§ 371 (c)(1),
(2) Date: Jul. 8, 2020

(87) PCT Pub. No.: WO2019/215805
PCT Pub. Date: Nov. 14, 2019

(65) Prior Publication Data
US 2021/0066161 A1    Mar. 4, 2021

(51) Int. Cl.
*H01L 23/40*    (2006.01)
*H01L 23/29*    (2006.01)
(Continued)

(52) U.S. Cl.
CPC ........ *H01L 23/4006* (2013.01); *H01L 23/293* (2013.01); *H05K 7/12* (2013.01);
(Continued)

(58) Field of Classification Search
CPC ...... H05K 7/12; H05K 7/1432; H05K 7/2049; H05K 7/209; H05K 7/20154;
(Continued)

(56) References Cited

U.S. PATENT DOCUMENTS

| 4,845,590 A * | 7/1989 | Mikolajczak ....... H01L 23/4093 361/720 |
| 6,449,157 B1 * | 9/2002 | Chu .................... H01L 23/4093 165/185 |

(Continued)

FOREIGN PATENT DOCUMENTS

| DE | 102015202300 A1 * | 8/2016 | ......... H01L 23/4006 |
| EP | 1508916 A1 * | 2/2005 | ......... H01L 23/4006 |

(Continued)

OTHER PUBLICATIONS

JP2005235992A English Translation (Year: 2005).*
Office Action dated Jun. 24, 2022 in German Application No. 112018007572.9.

*Primary Examiner* — Zachary Pape
*Assistant Examiner* — Amir A Jalali
(74) *Attorney, Agent, or Firm* — Sughrue Mion, PLLC; Richard C. Turner

(57) ABSTRACT

A member to be fastened on one side of which a member to be fixed is placed; a plate-shaped holding spring member which is disposed on the member to be fixed on one side thereof opposite to the member to be fastened; a support which extends outward of an end part of a longitudinal central part of the plate-shaped holding spring member and which has a through hole formed therein; a supporting column which is provided on the support and bends toward the member to be fastened; a fixing screw hole which is provided in the member to be fastened and disposed at a position corresponding to the through hole of the support so as to have the same axial center as the through hole; and a fixing screw which is inserted into the through hole of the support and screwed to the fixing screw hole.

20 Claims, 5 Drawing Sheets

(51) Int. Cl.
*H05K 7/12* (2006.01)
*H05K 7/20* (2006.01)
*H05K 7/14* (2006.01)

(52) U.S. Cl.
CPC ...... *H05K 7/2049* (2013.01); *H01L 2023/405* (2013.01); *H01L 2023/4087* (2013.01); *H05K 7/1432* (2013.01); *H05K 7/20509* (2013.01)

(58) Field of Classification Search
CPC .. H05K 7/2039; H05K 7/20463; H05K 7/205; H05K 7/2089–209; H05K 7/20509; H05K 5/02; H05K 5/0239; H05K 5/0247; H01L 23/40–4006; H01L 23/4037; H01L 23/405; H01L 23/293; H01L 23/367; H01L 2023/4081–4087; H01L 2023/4043; H01L 2023/4062; H01L 2023/4087; H01L 2023/405; H02M 7/003; F16B 21/00
See application file for complete search history.

(56) References Cited

U.S. PATENT DOCUMENTS

| | | | |
|---|---|---|---|
| 6,639,800 B1 | 10/2003 | Eyman et al. | |
| 7,274,572 B2 * | 9/2007 | Wang | H05K 7/20154 165/185 |
| 2005/0264999 A1 * | 12/2005 | Kalyandurg | H01L 23/4006 361/704 |
| 2008/0225185 A1 * | 9/2008 | Yoder | H04N 5/74 348/755 |
| 2009/0039504 A1 * | 2/2009 | Kimura | H01L 23/16 257/718 |
| 2012/0218712 A1 * | 8/2012 | Hayashi | H05K 7/2049 361/704 |
| 2015/0070847 A1 * | 3/2015 | Eom | H01L 23/4093 361/717 |
| 2015/0342097 A1 * | 11/2015 | Koeppel | H05K 1/0203 361/679.31 |
| 2016/0073549 A1 | 3/2016 | Liu et al. | |
| 2016/0233597 A1 * | 8/2016 | Binder | H05K 7/2049 |
| 2017/0314922 A1 * | 11/2017 | Poulad | H05K 7/1422 |
| 2019/0104608 A1 * | 4/2019 | Laurent | H01L 23/40 |

FOREIGN PATENT DOCUMENTS

| | | | | |
|---|---|---|---|---|
| JP | 2005-235992 A | | 9/2005 | |
| JP | 2005235992 A | * | 9/2005 | ..... H01L 2924/0002 |
| JP | 2015-118985 A | | 6/2015 | |
| TW | M349083 U | | 1/2009 | |
| WO | WO-2005094087 A1 | * | 10/2005 | ........... H05K 7/1053 |

* cited by examiner

FASTENING STRUCTURE AND POWER CONVERSION APPARATUS USING FASTENING STRUCTURE

CROSS REFERENCE TO RELATED APPLICATIONS

This application is a National Stage of International Application No. PCT/JP2018/017729 filed May 8, 2018.

TECHNICAL FIELD

The present application relates to the field of a fastening structure for fixing a member to be fixed, which is placed on a member to be fastened, with a plate-shaped spring member and a power conversion apparatus using the fastening structure.

BACKGROUND ART

In an existing fastening structure, a member to be fixed constituted of a semiconductor module in which a semiconductor element is resin sealed, for example, is placed on a member to be fastened constituted of a heat sink, for example. A screw through hole is provided in a central part of the member to be fixed constituted of the semiconductor module, and a screw hole is provided in the member to be fastened, constituted of the heat sink, at a position corresponding to the screw through hole of the member to be fixed.

A plate-shaped holding spring member having a pent-roof shape in cross section is disposed on the member to be fixed constituted of the semiconductor module on one side thereof opposite to the member to be fastened, and is provided with a screw through hole at a position corresponding to the screw through hole of the member to be fixed. A reinforced beam for reinforcing the plate-shaped holding spring member is provided on the plate-shaped holding spring member in a central part in the longitudinal direction of the plate-shaped holding spring member. The reinforced beam is also provided with a screw through hole at a position corresponding to the screw through hole of the member to be fixed.

For assembling these components, the member to be fixed constituted of the semiconductor module, the plate-shaped holding spring member, and the reinforced beam are placed on the member to be fastened constituted of the heat sink while the screw hole and the screw through holes are aligned with respect to each other, and the member to be fixed is fixed on the member to be fastened by fastening them with a fixing screw with a desired load.

In this event, the fastening force of the fixing screw is distributed by flexure of the plate-shaped holding spring member and, by the time the plate-shaped holding spring member is fully compressed, a desired uniform load can be applied to the member to be fixed. This effect is brought by the pent-roof-shaped cross section of the plate-shaped holding spring member. In addition, by using the reinforced beam, it is possible to strengthen the flexural rigidity of the plate-shaped holding spring member and press the plate-shaped holding spring member against the member to be fixed further uniformly (PTL 1, for example).

CITATION LIST

Patent Literature

PTL 1: JP-A-2005-235992

SUMMARY OF INVENTION

Technical Problem

In the existing fastening structure described above, the screw through hole is provided in the central part of the member to be fixed, which causes an increase in size of the member to be fixed. Besides, there is another problem that the screw hole needs to be provided in the member to be fastened and the through holes need to be provided respectively in the plate-shaped holding spring member and the reinforced beam so as to correspond to the screw through hole of the member to be fixed, and alignment of the screw hole and the screw through holes with respect to each other is very troublesome.

Specifically, there is a problem that the fixing screw needs to be first inserted into the through hole of the reinforced beam, then inserted into the through hole of the plate-shaped holding spring member with the position of the fixing screw adjusted, then inserted into the through hole of the member to be fixed with the position of the fixing screw adjusted, and then screwed into the screw hole of the member to be fastened with the position of the fixing screw adjusted.

In addition, in the case of fastening, with a screw, the plate-shaped holding spring member and the reinforced beam with no member to be fixed interposed, a column member such as a bush for supporting the plate-shaped holding spring member and the reinforced beam is needed. Alternatively, a boss needs to be provided on the member to be fastened side, which poses a problem that the number of components increases and a space for the column member needs to be secured.

The present application has been made to solve the above problem and an object of the present application is to provide a fastening structure capable of fixing a member to be fixed to a member to be fastened with a plate-shaped holding spring member without providing a screw through hole in the member to be fixed, within a limited space, and without increasing the number of components.

Solution to Problem

A fastening structure disclosed in the present application includes: a member to be fastened on one side of which a member to be fixed is placed; a plate-shaped holding spring member which is disposed on the member to be fixed on one side thereof opposite to the member to be fastened; a support which extends outward of an end part of a longitudinal central part of the plate-shaped holding spring member and which has a through hole formed therein; a supporting column which is provided on the support and bends toward the member to be fastened; a fixing screw hole which is provided in the member to be fastened and disposed at a position corresponding to the through hole of the support so as to have the same axial center as the through hole; and a fixing screw which is inserted into the through hole of the support and screwed to the fixing screw hole.

Advantageous Effects of Invention

The fastening structure disclosed in the present application can fix the member to be fixed to the member to be fastened without providing a screw through hole in the member to be fixed.

DESCRIPTION OF EMBODIMENTS

First Embodiment

Figure 1:
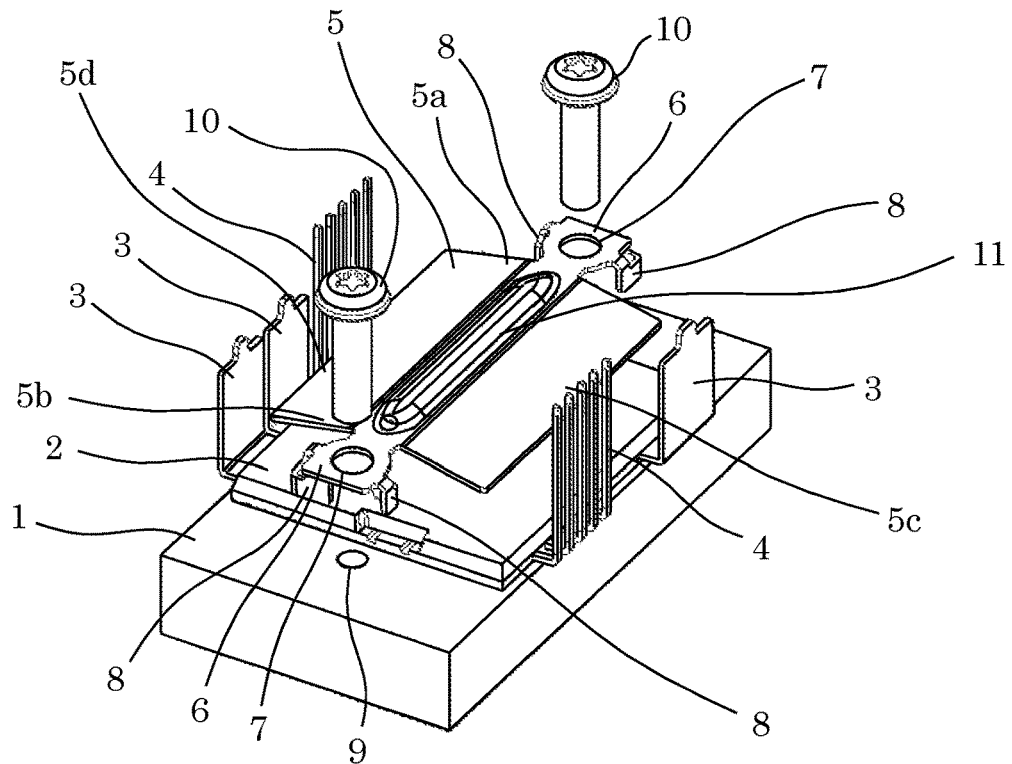
FIG. 1 is an exploded perspective view illustrating a fastening structure according to the first embodiment.
Figure 2:
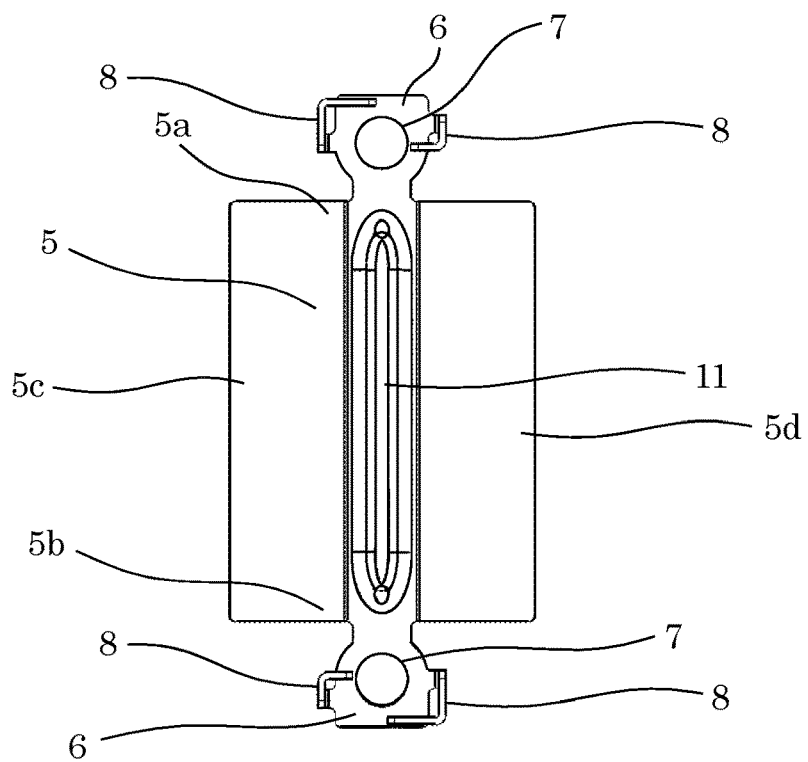
FIG. 2 is a front view of the fastening structure according to the first embodiment in which a plate-shaped holding spring member located in the fastening structure is seen from a member to be fixed side.

FIG. 1 is an exploded perspective view illustrating a fastening structure according to the first embodiment. FIG. 2 is a front view in which a plate-shaped holding spring member located in the fastening structure according to the first embodiment is seen from a member to be fixed side.

A member to be fixed (hereinafter referred to as a semiconductor module) 2 constituted of a semiconductor module in which a semiconductor element is resin sealed, for example, is placed on a face on one side of a member to be fastened (hereinafter referred to as a heat sink) 1 constituted of a heat sink, for example. The semiconductor module 2 is cooled by the heat sink 1. The semiconductor module 2 is provided with power terminals 3 and control terminals 4.

A plate-shaped holding spring member 5 is disposed on the semiconductor module 2 on one side thereof opposite to the heat sink, and this plate-shaped holding spring member 5 has a pent-roof shape in cross section as in the existing one described above. The plate-shaped holding spring member 5 is provided with supports 6 that extend outward of end parts 5a and 5b of a longitudinal central part of the plate-shaped holding spring member and that have through holes 7 respectively formed therein, and the supports 6 and the plate-shaped holding spring member 5 are formed to have an integral structure. Side parts 5c and 5d that extend orthogonal to the longitudinal direction of the plate-shaped holding spring member 5 incline toward the semiconductor module 2 with respect to the longitudinal central part of the plate-shaped holding spring member 5. This inclination structure generates a spring force of the plate-shaped holding spring member 5.

The supports 6 provided integrally to the plate-shaped holding spring member 5 are each provided with supporting columns 8 that bend toward the heat sink 1. The supporting columns 8 are arranged on the support 6 at a position around the through hole 7, that is, at a position outside a fixing screw to be described later, and a tip part of each of the bending supporting columns 8 is brought into contact with the face of the heat sink 1. In addition, the supporting column 8 makes it possible to prevent the fixing screw from falling toward the outside due to an axial force generated at the time of fastening the fixing screw.

A fixing screw hole 9 is disposed in the heat sink 1 at a position corresponding to the through hole 7 of each of the supports 6 so as to have the same axial center as the through hole. A fixing screw 10 is inserted into the through hole 7 of the support 6 and screwed to the fixing screw hole 9 of the heat sink 1, whereby the semiconductor module 2 is fixed on the heat sink 1 by the spring force of the plate-shaped holding spring member 5.

The plate-shaped holding spring member 5 is provided with a convex rib 11 on one side of the plate-shaped holding spring member 5 opposite to the semiconductor module at a position between the end part 5a and the end part 5b of the longitudinal central part of the plate-shaped holding spring member 5. This convex rib 11 is formed to have a convex shape on one side of the longitudinal central part of the plate-shaped holding spring member 5 opposite to the semiconductor module by, for example, machining the longitudinal central part of the plate-shaped holding spring member 5 on the semiconductor module side so that it has a concave shape.

In this manner, owing to the rib 11 formed to have an integral structure with the plate-shaped holding spring member 5, a pressing force generated by the plate-shaped holding spring member 5 is uniformed in the screw fastening direction. At the same time, since the rib 11 is provided to have a convex shape in the direction opposite to that of the semiconductor module 2, the clearance of the plate-shaped holding spring member 5 in the height direction thereof at the time of being compressed can be managed easily when the fixing screws 10 are fastened thereto.

The semiconductor module 2 is placed on the heat sink 1, and the plate-shaped holding spring member 5 is placed on the semiconductor module 2. Before the fixing screws 10 are fastened, the side parts 5c and 5d of the plate-shaped holding spring member 5 are brought into contact with the semiconductor module 2 and the longitudinal central part of the plate-shaped holding spring member 5 is located slightly away from a face of the semiconductor module 2. The supports 6 provided integrally to the plate-shaped holding spring member 5 are also located slightly away from the face of the semiconductor module 2.

In the above state, by inserting the fixing screws 10 into the through holes 7 of the supports 6 and screwing the fixing screws 10 into the fixing screw holes 9 of the heat sink 1, the longitudinal central part of the plate-shaped holding spring member 5 and the supports 6 are brought into contact with the face of the semiconductor module 2.

In this event, the fastening force of the fixing screw 10 is distributed by flexure of the plate-shaped holding spring member 5 and, by the time the plate-shaped holding spring member 5 is fully compressed, a desired uniform load can be applied to the semiconductor module 2. This effect is brought by the pent-roof-shaped cross section of the plate-shaped holding spring member 5. In addition, the rib 11 formed to have an integral structure with the plate-shaped holding spring member 5 can strengthen the flexural rigidity of the plate-shaped holding spring member 5 and press the plate-shaped holding spring member 5 against the semiconductor module 2 further uniformly.

As has been described above, according to the first embodiment of the present application, no through hole is provided in the semiconductor module 2, the plate-shaped holding spring member 5, and the rib 11, and the plate-shaped holding spring member 5 and the rib 11 have an integral structure. Thus, a reinforced beam as a separate body from the plate-shaped holding spring member is not needed unlike the existing one described above. This makes it possible to reduce the number of components and machining work, and thereby to achieve a fastening structure that is economically efficient.

In addition, since the through holes 7 are arranged in the supports 6 that extend outward of the end parts 5a and 5b of the longitudinal central part of the plate-shaped holding spring member 5 and the fixing screw holes 9 are arranged in the heat sink 1 at positions corresponding to the through holes 7, it is possible to insert the fixing screws 10 into the through holes 7 and screw them into the fixing screw holes 9 of the heat sink 1 easily by checking with eyes, and thereby to easily fix the semiconductor module 2 to the heat sink 1 with the plate-shaped holding spring member 5 and carry out fixing work efficiently.

Second Embodiment

Figure 3:
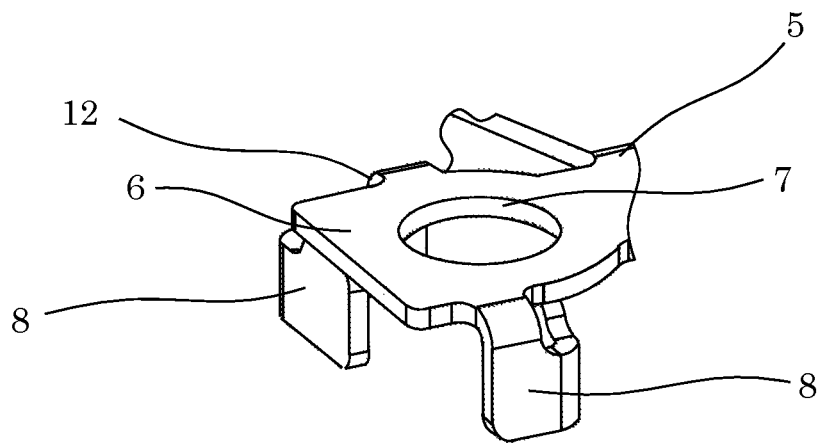
FIG. 3 is a main part enlarged perspective view illustrating a main part of a fastening structure according to the second embodiment.
Figure 4:
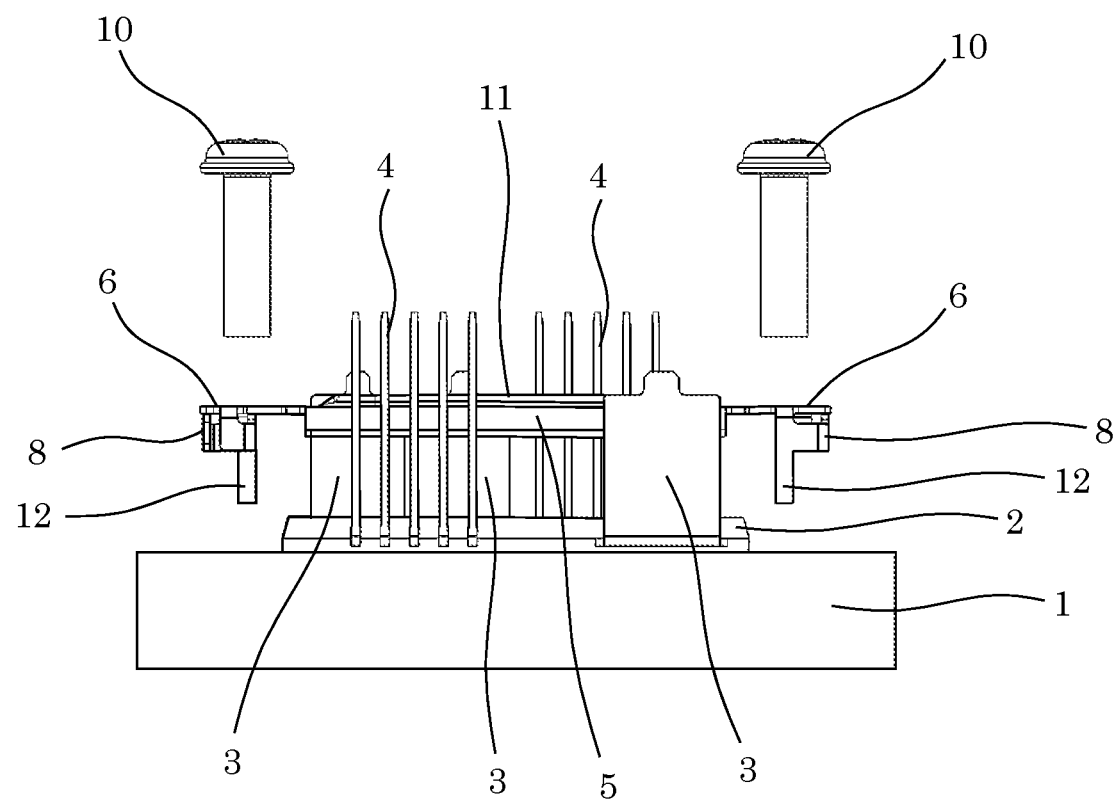
FIG. 4 is a side view illustrating the fastening structure according to the second embodiment.
Figure 5:
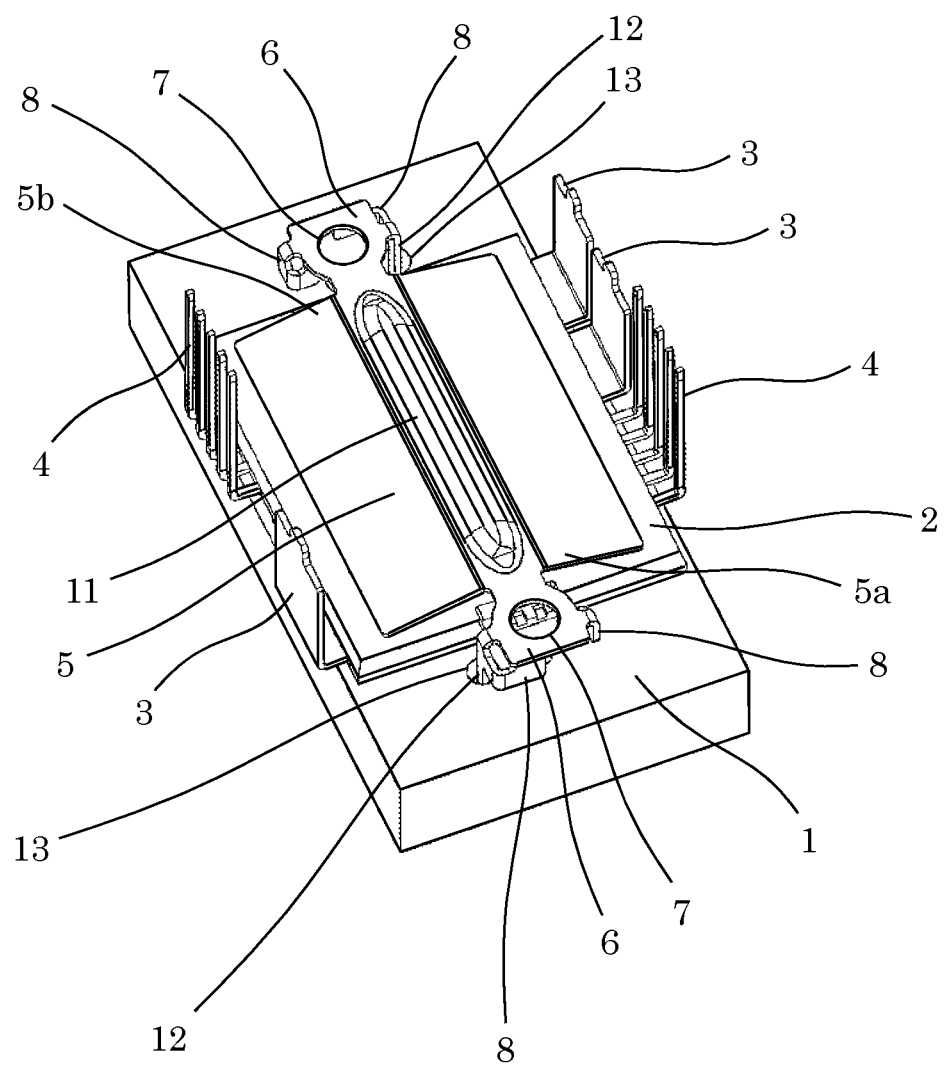
FIG. 5 is a perspective view illustrating the fastening structure according to the second embodiment.

FIG. 3 is a main part enlarged perspective view illustrating a main part of a fastening structure according to the second embodiment. FIG. 4 is a side view illustrating the fastening structure according to the second embodiment. FIG. 5 is a perspective view illustrating the fastening structure according to the second embodiment.

In the second embodiment, each of the supports 6 provided integrally to the plate-shaped holding spring member 5 is provided with an alignment protrusion 12 that bends toward the heat sink 1 and is designed to align the plate-shaped holding spring member with respect to the heat sink 1. The alignment protrusion 12 engages with an engagement hole 13 provided in the heat sink 1.

In this manner, according to the second embodiment, the alignment protrusion 12 provided to each of the supports 6 of the plate-shaped holding spring member 5 engages with the engagement hole 13 provided in the heat sink 1. Thus, in addition to the effect of the first embodiment described above, this brings about an effect of reliably aligning the components with respect to each other and preventing them from turning over each other.

In addition, since the alignment protrusions 12 are arranged at diagonal positions of the plate-shaped holding spring member 5, they can be mounted irrespective of the orientation of the plate-shaped holding spring member 5, thus making them easier to mount.

Third Embodiment

Figure 6:
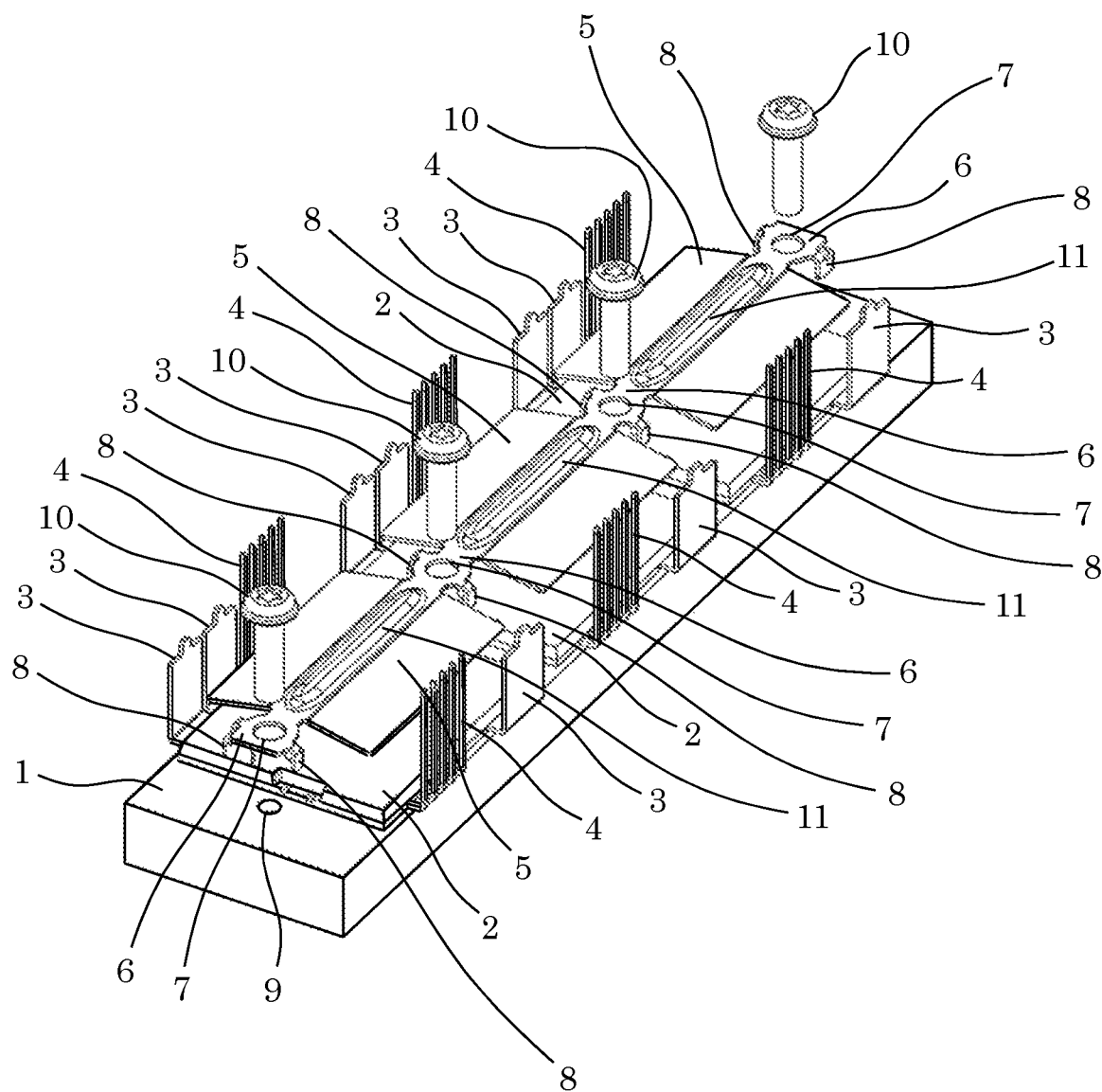
FIG. 6 is an exploded perspective view illustrating a fastening structure according to the third embodiment.
Figure 7:
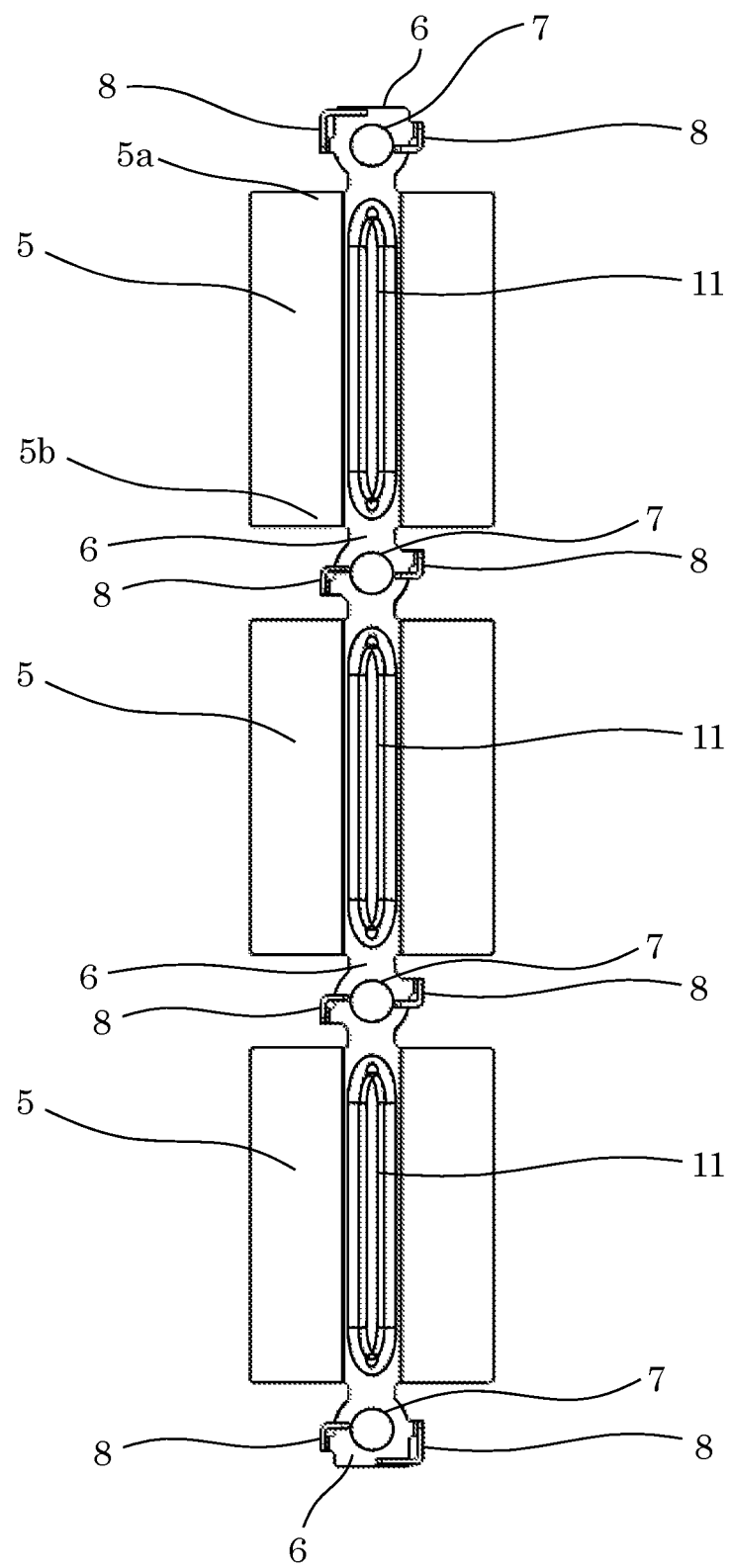
FIG. 7 is a front view of the fastening structure according to the third embodiment in which a plate-shaped holding spring member located in the fastening structure is seen from a member to be fixed side.

FIG. 6 is a main part enlarged side view illustrating a main part of a fastening structure according to the third embodiment. FIG. 7 is a view of the main part of the fastening structure according to the third embodiment seen from the bottom to the top.

The third embodiment illustrates a case of arranging the multiple semiconductor modules 2 in series in the longitudinal direction of the heat sink 1, and the three semiconductor modules 2 are arranged in series in the longitudinal direction, for example.

Likewise, the multiple plate-shaped holding spring members 5 are arranged in series in the longitudinal direction. The supports 6 of the plate-shaped holding spring members 5 located between the adjacent two plate-shaped holding spring members are formed to have a shared integral structure, and the through hole 7 is provided in the pitch center of the shared support 6 and the supporting columns 8 are provided at the pitch center of the shared support 6. Thus, such a structure can reduce the pitch between the adjacent modules.

In addition, since the screw hole 9 is provided in the heat sink 1 at a position corresponding to the through hole 7 located at the pitch center, it is possible to reduce the number of components of the plate-shaped holding spring members 5 or the fixing screws 10 relative to the number of semiconductor modules 2.

The third embodiment illustrates the case of arranging the three plate-shaped holding spring members and semiconductor modules. However, the number of these components is not limited to three. Instead, the fastening structure may have such a configuration that the two or four or more semiconductor modules are arranged in series and the two or four or more plate-shaped holding spring members are arranged, and this structure also brings about the same effect.

Meanwhile, a stainless (SUS) material is used as a material of the plate-shaped holding spring member in each of the embodiments. Thereby, when the member to be fixed is a semiconductor module, the plate-shaped holding spring member can exhibit a shielding effect as a noise shielding plate for inhibiting noise.

Note that, although the above embodiments illustrate the case of setting a semiconductor module as the member to be fixed, a self-heating reactor that needs to be cooled may be set as the member to be fixed.

By using any one of the above embodiments in a power conversion apparatus, this power conversion apparatus can exhibit the same effect as these embodiments.

Although the present application is described above in terms of various exemplary embodiments and implementations, it should be understood that the various features, aspects and functionality described in one or more of the individual embodiments are not limited in their applicability to the particular embodiment with which they are described, but instead can be applied, alone or various combinations to one or more of the embodiments. It is therefore understood that numerous modifications which have not been exemplified can be devised without departing from the scope of the present application. For example, at least one of the constituent components may be modified, added, or eliminated. At least one of the constituent components mentioned in at least one of the preferred embodiments may be selected and combined with the constituent components mentioned in another preferred embodiment.

INDUSTRIAL APPLICABILITY

The present application is favorable in implementing a fastening structure capable of fixing a member to be fixed to a member to be fastened with a plate-shaped holding spring member without providing a screw through hole in the member to be fixed.

REFERENCE SIGNS LIST

1: member to be fastened, 2: member to be fixed, 5: plate-shaped holding spring member, 6: support, 7: through hole, 8: supporting column, 9: through hole, 10: fixing screw, 11: rib, 12: alignment protrusion, 13: engagement hole.

The invention claimed is:
1. A fastening structure comprising:
a first member;
a second member provided on one side of the first member;
a plate-shaped holding spring member which is disposed on the second member on one side thereof opposite to the first member, the plate-shaped holding spring member comprising:

a longitudinal central part, that has a first end part and a second end part in respective longitudinal directions of the longitudinal central part, and a first side part and a second side part that are provided on respective sides of the longitudinal central part in respective directions that are orthogonal to the respective longitudinal directions, wherein the first side part and the second side part are inclined toward the second member with respect to the longitudinal central part and are configured to generate a spring force of the plate-shaped holding spring member;

a support which extends outward of the first end part of the longitudinal central part of the plate-shaped holding spring member and which has a through hole formed therein;

a supporting column which is provided on the support and protrudes toward the second member;

a fixing screw hole which is provided in the first member and disposed at a position corresponding to the through hole of the support so as to have the same axial center as the through hole; and a fixing screw which is inserted into the through hole of the support and screwed to the fixing screw hole, such that the second member is fixed to the first member by the plate-shaped holding spring member.

2. The fastening structure according to claim 1, wherein the supporting column is disposed on the support at a position around the through hole, and a tip part of the supporting column is brought into contact with the first member.

3. The fastening structure according to claim 2, wherein the support of the plate-shaped holding spring member is provided with an alignment protrusion which is designed to align the plate-shaped holding spring member with respect to the first member, and an engagement hole to engage with the alignment protrusion is provided in the first member.

4. The fastening structure according to claim 3, wherein the plate-shaped holding spring member is provided with a convex rib on one side of the plate-shaped holding spring member opposite to the second member at a position between the first end part and the second end part of the longitudinal central part of the plate-shaped holding spring member.

5. A power conversion apparatus using the fastening structure according to claim 3.

6. The fastening structure according to claim 2, wherein the plate-shaped holding spring member is provided with a convex rib on one side of the plate-shaped holding spring member opposite to the second member at a position between the first end part and the second end part of the longitudinal central part of the plate-shaped holding spring member.

7. The fastening structure according to claim 2, wherein the plate-shaped holding spring member is made of a stainless material.

8. The fastening structure according to claim 2, wherein the second member is a semiconductor module in which a semiconductor element is resin sealed.

9. The fastening structure according to claim 2, wherein the first member is a heat sink.

10. A power conversion apparatus using the fastening structure according to claim 2.

11. The fastening structure according to claim 1, wherein the support of the plate-shaped holding spring member is provided with an alignment protrusion which is designed to align the plate-shaped holding spring member with respect to the first member, and an engagement hole to engage with the alignment protrusion is provided in the first member.

12. The fastening structure according to claim 11, wherein the plate-shaped holding spring member is provided with a convex rib on one side of the plate-shaped holding spring member opposite to the second member at a position between the first end part and the second end part of the longitudinal central part of the plate-shaped holding spring member.

13. A power conversion apparatus using the fastening structure according to claim 11.

14. The fastening structure according to claim 1, wherein the plate-shaped holding spring member is provided with a convex rib on one side of the plate-shaped holding spring member opposite to the second member at a position between the first end part and the second end part of the longitudinal central part of the plate-shaped holding spring member.

15. The fastening structure according to claim 1, wherein the plate-shaped holding spring member is made of a stainless material.

16. The fastening structure according to claim 1, further comprising:

an additional second member provided on the one side of the first member;

an additional plate-shaped holding spring member which is disposed on the additional second member on one side thereof opposite to the first member, the additional plate-shaped holding spring member comprising an additional longitudinal central part that has a third end part and a fourth end part in the respective longitudinal directions; and a first additional support which extends outward of the third end part of the additional longitudinal central part of the additional plate-shaped holding spring member and which has a through hole formed therein, the first additional support connecting the second end part of the longitudinal central part to the third end part of the additional longitudinal central part;

a second additional support which extends outward of the fourth end part of the additional longitudinal central part of the additional plate-shaped holding spring member and which has a through hole formed therein;

a first additional supporting column which is provided on the first additional support and protrudes toward the second member;

a second additional supporting column which is provided on the second additional support and protrudes toward the second member;

a first additional fixing screw hole which is provided in the first member and disposed at a position corresponding to the through hole of the first additional support so as to have the same axial center as the through hole of the first additional support;

a second additional fixing screw hole which is provided in the first member and disposed at a position corresponding to the through hole of the second additional support so as to have the same axial center as the through hole of the second additional support;

a first additional fixing screw which is inserted into the through hole of the first additional support and screwed to the first additional fixing screw hole, such that the second member and the additional second member are fixed to the first member by the plate-shaped holding spring member and the additional plate-shaped holding spring member, respectively; and a second additional fixing screw which is inserted into the through hole of the second additional support and screwed to the second additional fixing screw hole, such that the additional second member is fixed to the first member by the additional plate-shaped holding spring member.

17. The fastening structure according to claim 16, wherein the first additional support integrally connects the second end part of the longitudinal central part to the third end part of the additional longitudinal central part.

18. The fastening structure according to claim 1, wherein the second member is a semiconductor module in which a semiconductor element is resin sealed.

19. The fastening structure according to claim 1, wherein the first member is a heat sink.

20. A power conversion apparatus using the fastening structure according to claim 1.

\* \* \* \* \*